April 9, 1968

J. B. LAZARUS ETAL 3,376,920

COMBINATION SHIELD CAN AND HEAT DISSIPATOR FOR
ELECTRONIC CIRCUITRY USING A TRANSISTOR
Filed Aug. 31, 1966

INVENTORS.
JEROME B. LAZARUS
EDMUND G. TRUNK

BY

James and Franklin

ATTORNEYS

United States Patent Office 3,376,920
Patented Apr. 9, 1968

3,376,920

COMBINATION SHIELD CAN AND HEAT DISSIPATOR FOR ELECTRONIC CIRCUITRY USING A TRANSISTOR

Jerome B. Lazarus, Bay Shore, and Edmund G. Trunk, East Meadow, N.Y., assignors to The Staver Company Incorporated, Bay Shore, N.Y., a corporation of New York Filed Aug. 31, 1966, Ser. No. 576,468
5 Claims. (Cl. 165—80)

ABSTRACT OF THE DISCLOSURE

A combination shield can and heat dissipator is provided for use in electronic circuitry using a transistor, typically in the final amplifier stage of the intermediate frequency amplifier of a television receiver. A relatively large hollow inverted sheet metal can shields the coupling coil of the amplifier stage. The heat dissipator comprises a small strip of metal bent to form a body portion and spread wings, with the body portion fitting closely around the transistor, and the spread wings bearing against one wall of the shield can for good heat transfer from the dissipator to the can, so that the can then serves as a large area heat dissipator for the transistor, in addition, to acting as a shield for the coil. In preferred form an upright wall of the can has a vertical slot near and extending to the bottom of the can, and the body portion of the dissipator passes through the slot. The spread wings are received within and bear against the inside wall of the can.

This invention relates to heat dissipators for transistors, and more particularly for a transistor used in an amplifier.

Transistors have come into wide use. Because of their small physical dimension there is difficulty in providing adequate heat dissipation, and numerous types of heat dissipators have been devised to effectively increase the surface area of the transistor for improved heat dissipation.

The circuitry in which the transistors are used frequently employs shield cans for relatively large components, such as a coupling coil or transformer for an amplifier stage. As one example we may mention the intermediate frequency amplifier of a television receiver. This commonly has three stages, and in the third stage the energy being handled grows to considerable volume, and requires a substantial amount of heat dissipation.

One object of the present invention is to improve heat dissipators for use on transistors, or more generally on semi-conductor components which are of small dimension and which require heat dissipation.

Another object is to combine the heat dissipator with a shield can, so that the shield can serves an additional purpose by acting as a heat dissipator of large surface area.

Still another object is to devise a small heat dissipator for the transistor, which combines in very simple fashion with the relatively large shield can, the two being joined over an appreciable area for good heat transfer from the dissipator to the can.

To accomplish the foregoing general objects, and other more specific objects which will hereinafter appear, our invention resides in the shield can and heat dissipator elements and their relation one to another, as are more particularly described in the following specification. The specification is accompanied by a drawing in which.

Figure 1:
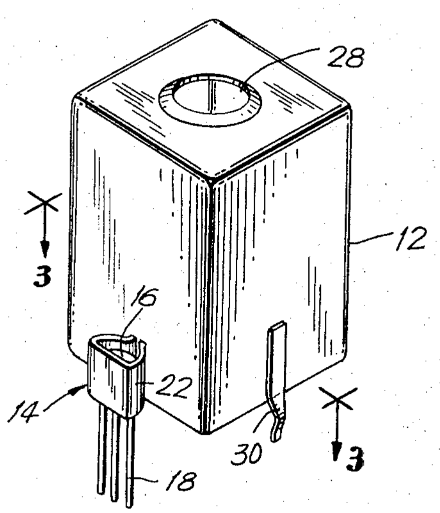
FIG. 1 is a perspectivie view showing a combination shield can and heat dissipator.

Referring to FIG. 1 of the drawing, the combination can and dissipator comprises a metal can 12 dimensioned to shield a relatively large component such as a coupling coil or transformer, and a small metal heat dissipator 14 which is shaped and dimensioned to fit closely around a transistor, here indicated at 16 with its leads projecting downwardly therefrom at 18. The two are joined for an appreciable area for good heat transfer from the dissipator 14 to the can 12, so that the can 12 then serves as a large area heat dissipator for the transistor 16, in addition to acting as a shield for the component therein which is to be shielded.

Figure 2:
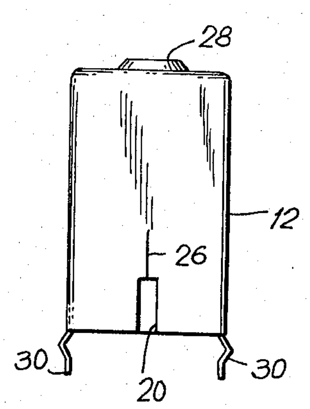
FIG. 2 is a front elevation of the shield can before the heat dissipator is applied thereto.
Figure 3:
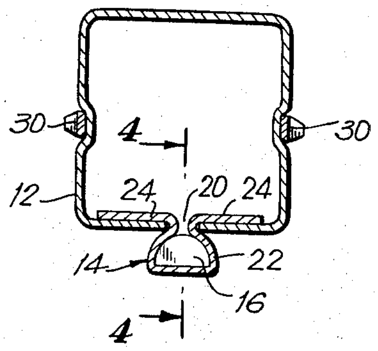
FIG. 3 is a horizontal section taken approximately on the line 3—3 of FIG. 1.
Figure 4:
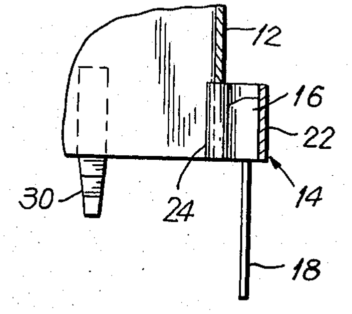
FIG. 4 is a fragmentary section taken on the line 4—4 of FIG. 3.

Referring to FIG. 2, one wall of the can has a vertical slot 20 near and extending to the bottom edge of the can. Referring next to FIG. 3, the small heat dissipator is a strip of metal bent to form a body portion 22 and spread wings 24. The body portion 22 fits closely about the transistor, and its constricted part or neck passes through the slot 20. The spread wings 24 are received within and bear against the inside of the can, thus providing the desired contact area for heat transfer.

Reverting to FIG. 2 the can wall may, if desired, be slit as shown at 26, directly above the slot 20. This increases the yieldability of the can wall and its ability to accommodate the small dissipator 14 when the latter is joined to the can. This extra slit is optional, and usually is not needed.

The shield cans vary considerably in configuration, proportioning, and dimension. They may also vary in other respects, some having a hole in the top as shown at 28, and others having a continuous top with no hole. they also differ in provision for mounting on a chassis or a printed circuit board. One common arrangement is to provide two resilient tongues 30 which are received through mating holes in a printed circuit board, with a resilient or snap fit. These may also provide a ground connection. The illustrated tongues are merely one example of the different mounting means which may be used.

The shield cans may be made of tin plated steel, brass, copper or other metal, but most commonly are made of relatively soft sheet aluminum which is drawn to the desired can configuration. The small dissipator 14 also may be made of sheet aluminum, but preferably of a somewhat harder aluminum alloy affording some resilience. Similar remark applies to the tongues 30, which may be attached to the can in various known ways, as by use of integral tangs which penetrate the softer aluminum of the can.

The particular transistor here shown is an inexpensive one having a plastic body. This increases the problem of heat transfer, and the large area shield can is helpful. However, a transistor having a cylindrical metal body is more commonly employed, and the small dissipator then takes the configuration shown in FIG. 5, the body 32 being cylindrical to receive the cylindrical transistor 34. The outwardly directed wings 36 of the small dissipator are received within and bear against the wall 38 of the shield can, the same as in FIG. 3. In this case the tongues 39 of the can 38 are secured inside instead of outside the can.

The leads of the transistor may pass through a printed circuit board in conventional fashion, and be soldered to the printed lines on the bottom face of the board, all in accordance with usual practice.

Figure 6:
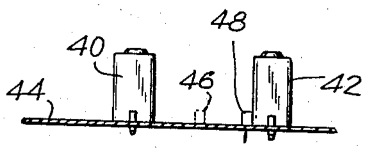
FIG. 6 is a fragmentary elevation drawn to small scale to show one example of the location of the improvement in an amplifier stage.

FIG. 6 schematically illustrates an amplifier stage with its input coil or transformer in a shield can 40, and its output coil or transformer in a shield can 42. These are mounted on a printed board 44. In prior practice the transistor would be located somewhere between the cans, say at 46, and the heat dissipator would be localized on the transistor. With the present improvement the transistor is located at 48 immediately against the can 42, with the latter acting as a large area heat dissipator, in addition to its usual function of preventing radiation from the coil to other parts of the chassis.

Figure 5:
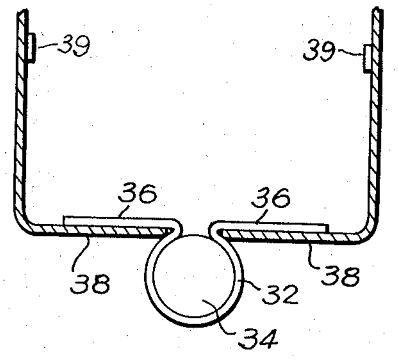
FIG. 5 is a horizontal section through a modification.

One advantage of the present improvement is its ease of manufacture. The small dissipator shown in FIG. 5 is even easier to manufacture than most prior dissipators. The shield can itself may be like that previously made except for the provision of the slot 20, and if desired the optionally usable slit 26.

It is believed that the construction and operation of our improved combination of shield can and heat dissipator, as well as the advantages thereof, will be apparent from the foregoing detailed description. The shielded component will usually be a coupling transformer, which is commonly called a "coil," although it sometimes has two windings, and used as a transformer, whether having one tapped winding or two windings. However, it will be understood that the component which is shielded could be some other component used near a transistor, the important thing being that the shield can is used for two purposes instead of one. It will also be understood that while the heat dissipating component is almost always a transistor it could be some other semiconductor which develops heat, for example a diode or a silicon controlled rectifier.

It will therefore be understood that while we have shown and described our invention in a preferred form, changes may be made without departing from the scope of the invention, as sought to be defined in the following claims. In the claims the term "transistor" 'has been used for convenience, but is not intended to exclude other small heat-generating semiconductor elements, as mentioned above.

We claim:

1. A combination shield can and heat dissipator for electronic circuitry using a transistor and a much larger component which is to be electrically shielded, said combination comprising a relatively large hollow inverted sheet metal can dimensioned to shield a relatively large component of a circuit, a small metal heat dissipator for a transistor, said small dissipator being a strip of metal bent to form a body portion and spread wings, said body portion being dimensioned to fit closely around a transistor, and said spread wings bearing against one upright wall of the shield can over an appreciable area for good heat transfer from the dissipator to the can, whereby the can then serves as a large area heat dissipator for a transistor, in addition to acting as a shield for a component which is to be shielded.

2. A combination shield can and heat dissipator as defined in claim 1, combined with circuitry, and in which the circuitry is an amplifier stage, and in which the component is a coupling coil for the said amplifier stage.

3. A combination shield can, heat dissipator, and amplifier stage as defined in claim 2, in which the said amplifier stage is the final stage of the intermediate frequency amplifier of a television receiver.

4. A combination shield can and heat dissipator as defined in claim 1, in which one upright wall of the can has a vertical slot near and extending to the bottom of the can, and in which the body portion of the small heat dissipator passes through the slot, and in which the spread wings are received within and bear against the inside wall of the can.

5. A combination shield can and heat dissipator as defined in claim 4, in which the said upright wall of the can has a vertical slit directly above and leading into the said vertical slot which slot receives the small dissipator.

References Cited

UNITED STATES PATENTS

| | | | |
|---|---|---|---|
| 2,489,245 | 11/1949 | Sola | 174—35 X |
| 2,651,007 | 9/1953 | Shepard et al. | 317—100 X |
| 2,696,595 | 12/1954 | Coster | 174—16 X |
| 2,732,418 | 1/1956 | Lindley | 174—16 |
| 2,735,636 | 2/1956 | Snyder | 174—35 X |
| 2,737,579 | 3/1956 | Wehrlin et al. | 174—35 X |
| 3,198,990 | 8/1965 | Katzin | 317—100 |
| 3,222,580 | 12/1965 | Curll | 174—35 X |
| 3,225,259 | 12/1965 | Handing | 174—35 X |

OTHER REFERENCES

Electron Design, July 5, 1962, p. 16 (Advertisement Staver).

ROBERT A. O'LEARY, *Primary Examiner.*

A. W. DAVIS, Jr., *Assistant Examiner.*